(12) United States Patent
Galbraith et al.

(10) Patent No.: US 8,599,973 B2
(45) Date of Patent: Dec. 3, 2013

(54) DETECTION OF SYNCHRONIZATION MARK FROM OUTPUT OF MATCHED FILTER UPSTREAM OF VITERBI DETECTOR

(75) Inventors: Richard Leo Galbraith, Rochester, MN (US); Weldon Mark Hanson, Rochester, MN (US); Travis Roger Oenning, Rochester, MN (US); Todd Carter Truax, Rochester, MN (US)

(73) Assignee: HGST Netherlands B.V., Amsterdam (NL)

( * ) Notice: Subject to any disclaimer, the term of this patent is extended or adjusted under 35 U.S.C. 154(b) by 873 days.

(21) Appl. No.: 12/150,822

(22) Filed: Apr. 30, 2008

(65) Prior Publication Data
US 2009/0274247 A1 Nov. 5, 2009

(51) Int. Cl.
*H03D 1/00* (2006.01)
*H04L 27/06* (2006.01)

(52) U.S. Cl.
USPC ............ 375/343; 375/340; 375/341; 375/344

(58) Field of Classification Search
USPC ........................................ 375/26, 262, 144
See application file for complete search history.

(56) References Cited

U.S. PATENT DOCUMENTS

| | | | |
|---|---|---|---|
| 6,023,386 A | 2/2000 | Reed et al. | |
| 6,032,284 A * | 2/2000 | Bliss | 714/792 |
| 6,115,198 A * | 9/2000 | Reed et al. | 360/46 |
| 6,603,622 B1 * | 8/2003 | Christiansen et al. | 360/66 |
| 7,010,065 B2 | 3/2006 | Cideciyan et al. | |
| 7,286,595 B2 | 10/2007 | Cideciyan et al. | |
| 7,440,208 B1 * | 10/2008 | McEwen et al. | 360/39 |
| 2002/0154430 A1 * | 10/2002 | Rae et al. | 360/25 |
| 2003/0123587 A1 * | 7/2003 | Blaum et al. | 375/354 |

* cited by examiner

*Primary Examiner* — Qutbuddin Ghulamali
(74) *Attorney, Agent, or Firm* — Billion & Armitage

(57) ABSTRACT

Embodiments of the present invention relate to the detection of synchronization marks in data storage and retrieval. According to one embodiment, synchronization marks are detected from the output of a matched filter, upstream of the Viterbi detector. This approach avoids the delay associated with the latency of the Viterbi output, thereby allowing time to align parity framing and to properly start the time-varying trellis. Certain embodiments disclose 34- and 20-bit primary synchronization marks located at the beginning of a data region. Other embodiments disclose 16-, 20-, and 24-bit embedded synchronization marks located within a data region.

26 Claims, 15 Drawing Sheets

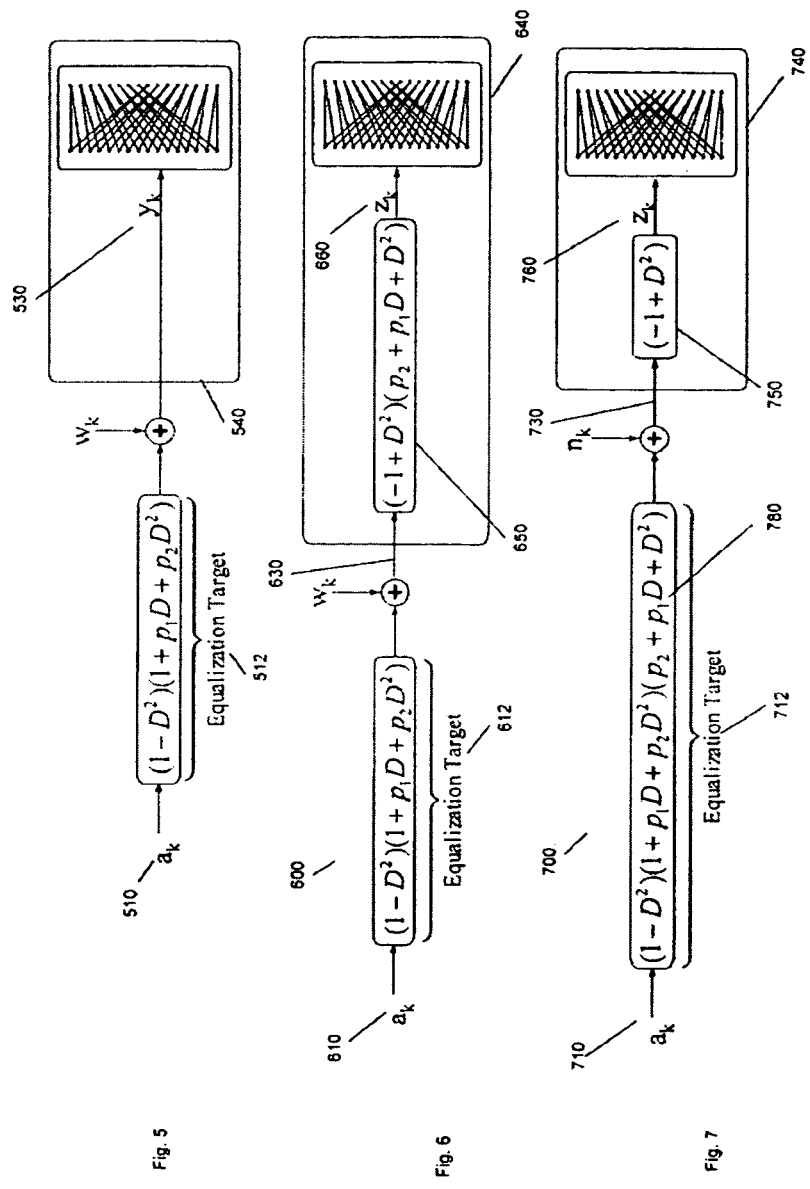

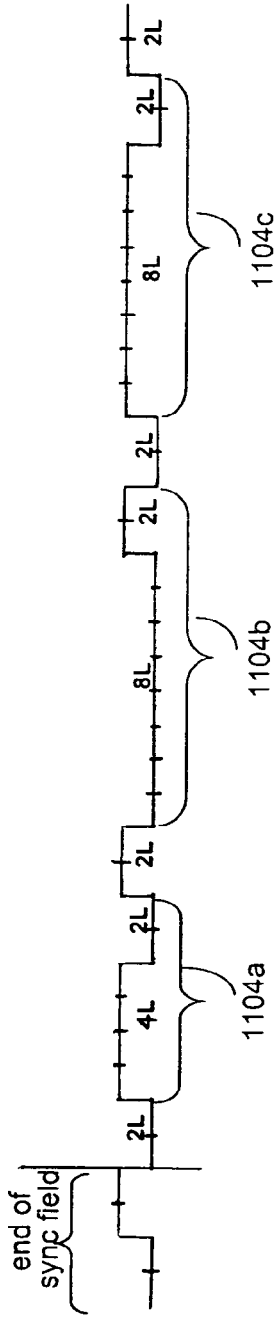
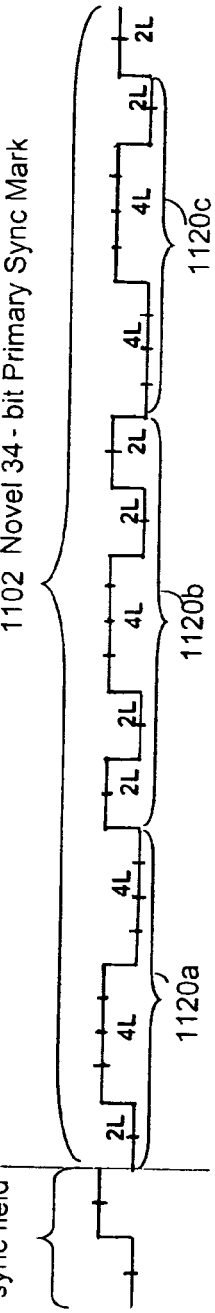
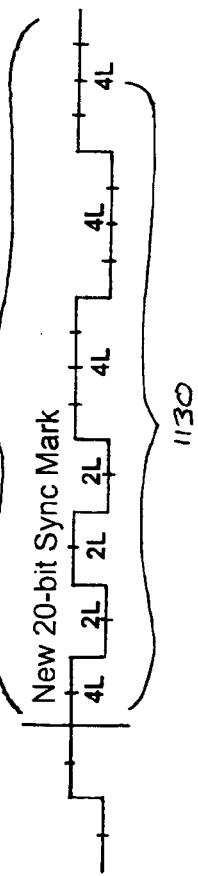

DETECTION OF SYNCHRONIZATION MARK FROM OUTPUT OF MATCHED FILTER UPSTREAM OF VITERBI DETECTOR

BACKGROUND OF THE INVENTION

Recently developed data storage devices, such as magnetic disk drive devices (i.e., hard disk drives), have increased storage capacity and increased data access speed. The magnetic disk drive devices have become widely used as auxiliary memory devices for computer systems. The primary components of a magnetic disk drive device that affect storage capacity and access speed are the magnetic recording head, the recording medium, the servo mechanism, the signal processing technique used in the read/write channel, and the like. A real densities increase, inter-symbol interference (ISI), transition-dependent noise and non-linear distortions at high densities, and bandwidth limitations at high data rates lead to performance degradation. For example, the level of IS between neighboring recorded bits in magnetic recording channels increases with recording density.

The signal processing techniques utilizing PRML (Partial Response Maximum Likelihood) detection have greatly contributed to the increased storage densities and high access speeds seen in modem magnetic disk drive devices. PRML data channels are synchronization data detection channels where synchronization refers to the frequency and phase locking of the channel to the readback signal in order to detect the data properly.

A Viterbi detector is used for detecting the data pulses in the digitized read signal and recovering the bits. Advanced replay equalizations have been adopted in the magnetic recording technology to shape the channel pulse response to some specified target shape, which has a shorter duration (higher bandwidth) and this is called partial-response signaling or equalization. The Viterbi detector that is matched to the target shape normally follows the partial response equalizer. The Viterbi detector recovers the encoded data that was originally recorded on the magnetic medium. Such a detector receives an equalized digital read signal and generates from it an encoded data signal, which is then decoded to produce the final read data signal.

At the heart of the Viterbi decoding algorithm is the trellis, which is an extension of the encoder state machine that shows the passage of time. A section of the trellis shows the possible state transitions and output code words for one period of the encoder. Every branch between two states represents a possible state change in the encoder. The Viterbi procedure determines the best path (most likely sequence of symbols from a finite alphabet) ending in each state j, where state j represents the memory in the channel, by comparing the samples in the sample sequence $y_0, y_1, \ldots y_n$ to the expected sequence of read back samples associated will all possible paths that can end in state j at time n.

A 16-state equalization target is a conventional approach for providing equalization in a PRML read data channel. An improvement has been made in equalization in U.S. Pat. No. 7,286,595 to Cideciyan et al, which is incorporated by reference herein for all purposes. The improvement includes a lengthened equalization target filter with a matched filter metric in a Viterbi detector. Maintaining precisely the desired partial response shape through adaptive equalizations at the channel output, permits the Viterbi detector to be efficiently realized and thus improves the bit detection quality.

For the data channel in a disk drive to read back data written in a sector, the channel must achieve both bit synchronization and word synchronization. Bit synchronization is the process of using acquisition gain and timing loops over a preamble pattern in order to achieve proper synchronization bit sampling, that is proper gain, phase, and frequency. Word synchronization is the process of finding the exact starting location of the data after the preamble field.

In current disk drives with increasing speed and data density, conventional word synchronization schemes are insufficient and generally provide poor performance. Miss-detecting the word synchronization pattern or Synchronization Mark ("SM") or finding it early or later, corrupts the data detection in the entire sector. When the word synchronization detector fails to start the data time-varying-trellis correctly at the start of data, then the data error rates are degraded.

An advancement has been described in U.S. Pat. No. 7,010,065 to Cideciyan et al, which is incorporated by reference herein for all purposes. There, word synchronization is used with large coding distance and fault tolerance for PRML systems.

While the above approach is useful, there is a need in the art for improved techniques data synchronization, and in particular for detecting synchronization marks.

BRIEF SUMMARY OF THE INVENTION

Embodiments of the present invention relate to the detection of synchronization marks in data storage and retrieval. According to one embodiment, synchronization marks are detected from the output of a matched filter, upstream of the Viterbi detector. This approach avoids the delay associated with the latency of the Viterbi output, thereby allowing time to align parity framing and to properly start the time-varying trellis. Certain embodiments disclose 34- and 20-bit primary synchronization marks located at the beginning of a data region. Other embodiments disclose 16-, 20-, and 24-bit embedded synchronization marks located within a data region.

An embodiment of an apparatus for synchronization detection in accordance with the present invention, comprises, an equalizer configured to receive a readback signal including a predefined synchronization pattern, and to generate a first equalized signal from a lengthened equalization target filter with a matched filter, wherein the predefined synchronization pattern comprises a plurality of synchronization pattern matches. A generator is configured to generate a second signal from the first equalized signal, the second signal comprising one of the synchronization pattern matches. An analyzer is configured to compare the second signal to a predefined criteria to generate an output, and a logic counter is configured to analyze the output from the second analyzer to generate a start of data trigger in subsequent data detection circuitry.

An embodiment of a method for synchronization detection in accordance with the present invention, comprises, applying a readback signal including a predefined synchronization pattern to an equalizer having a lengthened equalization target filter with a matched filter to generate a first equalized signal, wherein the predefined synchronization pattern comprises a plurality synchronization pattern matches. A second signal is produced from the first equalized signal, the second signal comprising one of the synchronization pattern matches. The second signal is compared to a predefined criteria, and a start of data trigger is generated in subsequent data detection circuitry based upon the predefined criteria.

Additional embodiments and features are set forth in part in the description that follows, and in part will become apparent to those skilled in the art upon examination of the specification or may be learned by the practice of the invention. A further understanding of the nature and advantages of the present invention may be realized by reference to the remaining portions of the specification and drawings.

BRIEF DESCRIPTION OF THE DRAWINGS

FIG. 5 illustrates a block diagram of a data channel that uses a conventional equalization target.

FIG. 6 illustrates a block diagram of a data channel that uses a conventional equalization target and a matched filter metric.

FIG. 7 illustrates a block diagram of a data channel that uses a matched 16 state equalization target and a matched filter metric.

FIG. 11A is a diagram illustrating a conventional 34-bit primary synchronization mark pattern.

FIGS. 11B-11C are diagrams illustrating 34-bit and 20-bit primary synchronization mars according to embodiments of the invention.

DETAILED DESCRIPTION OF THE INVENTION

Figure 1:
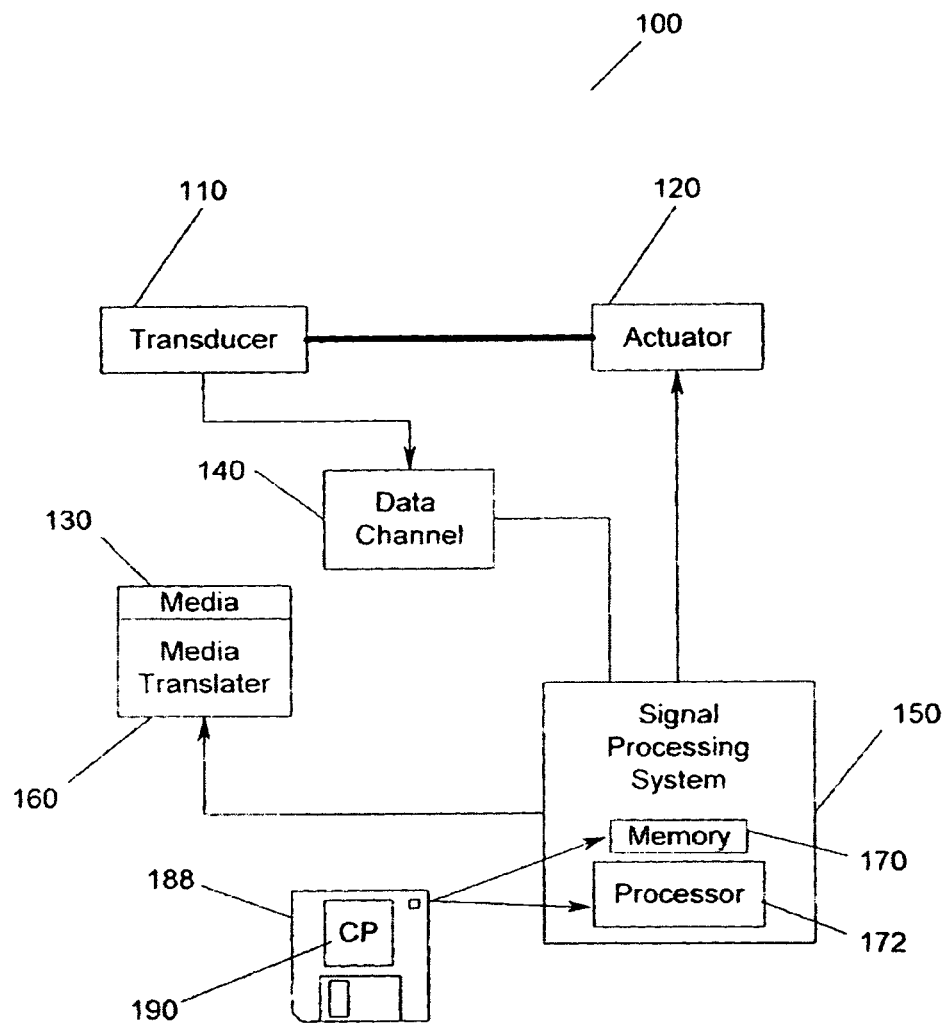
FIG. 1 illustrates a storage system according to embodiments of the invention.

FIG. 1 illustrates a storage system 100 according to an embodiment of the present invention. In FIG. 1, a transducer 110 is under control of an actuator 120. The actuator 120 controls the position of the transducer 110. The transducer 110 writes and reads data on magnetic media 130. The read/write signals are passed to a data channel 140. A signal processor system 150 controls the actuator 120 and processes the signals of the data channel 140. In addition, a media translator 160 is controlled by the signal processor system 150 to cause the magnetic media 130 to move relative to the transducer 110. Nevertheless, the present invention is not meant to be limited to a particular type of storage system 100 or to the type of media 130 used in the storage system 100.

Figure 2:
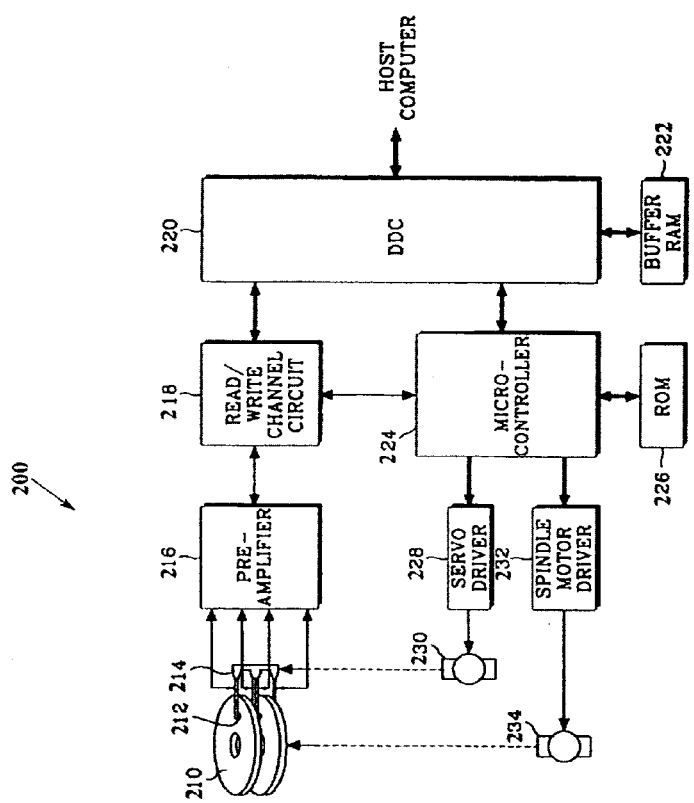
FIG. 2 is a block diagram of a magnetic disk drive device according to embodiments of the invention.

FIG. 2 is a block diagram of a magnetic disk drive device 200 according to an embodiment of the present invention. In FIG. 2, disks 210 are rotated by a spindle motor 234, and heads 212 are positioned at surfaces of corresponding ones of disks 210. Heads 212 are mounted on corresponding servo arms that extend from an E-shaped block assembly 214 to disks 210. Block assembly 214 has an associated rotary voice coil actuator 230 that moves block assembly 214 and thereby changes to positions of heads 212 for reading data from or writing data to a specified position on one or more of disks 210.

A pre-amplifier 216 pre-amplifies a signal picked up by heads 212 and thereby provides read/write channel circuit 218 with an amplified signal during a reading operation. During a write operation, pre-amplifier 216 transfers an encoded write data signal from the read/write channel circuit 218 to heads 212. In a read operation, read/write channel circuit 18 detects a data pulse from a read signal provided by pre-amplifier 216 and decodes the data pulse. Read/write channel circuit 218 transfers the decoded data pulse to a disk data controller (DDC) 20. Furthermore, read/write channel circuit 18 also decodes write data received from the DDC 220 and provides the decoded data to pre-amplifier 216.

DDC 220 both writes data received from a host computer (not shown) onto disks 210, through read/write channel circuit 18 and pre-amplifier 216, and transfers read data from disks 210 to the host computer. DDC 220 also interfaces between the host computer and a microcontroller 224. A buffer RAM (Random Access Memory) 222 temporarily stores data transferred between DDC 220 and the host computer, microcontroller 224, and read/write channel circuit 218. Microcontroller 224 controls track seeking and track following functions in response to read and write commands from the host computer.

A ROM (Read Only Memory) 226 stores a control program for microcontroller 224 as well as various setting values. A servo driver 228 generates a driving current for driving actuator 230 in response to a control signal, generated from microcontroller 224 that provides control of the position of heads 212. The driving current is applied to a voice coil of actuator 230. Actuator 230 positions heads 212 relative to disks 210 in accordance with the direction and amount of the driving current supplied from servo driver 228. A spindle motor driver 232 drives spindle motor 234, which rotates disks 210, in accordance with a control value generated from microcontroller 224 for controlling disks 210.

Figure 3:
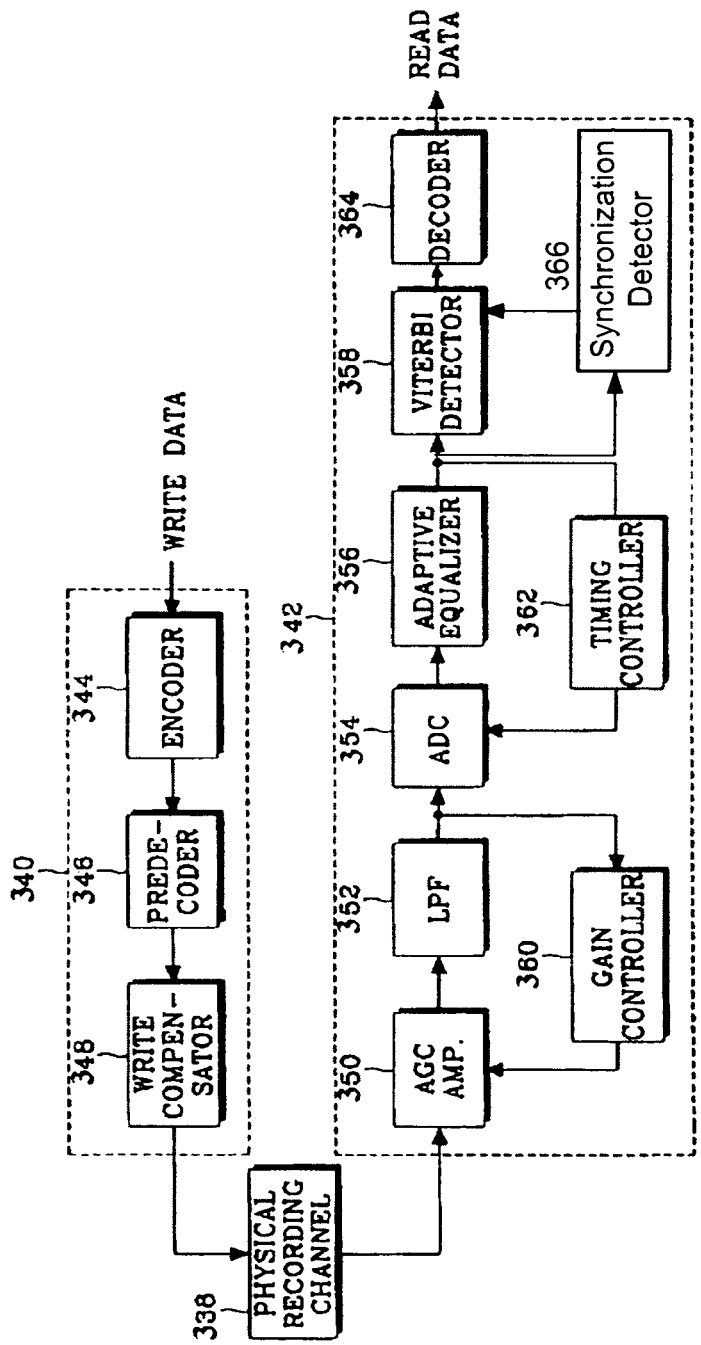
FIG. 3 is a block diagram of a read/write channel circuit of FIG. 2 that employs PRML detection according to embodiments of the invention.

FIG. 3 is a block diagram of a read/write channel circuit 300 of FIG. 2 that employs PRML detection. In FIG. 3, the read/write channel circuit 300 includes a physical recording channel 338 having a read/write means and a recording medium, a write channel circuit 340 for writing data onto the recording medium, and a read channel circuit 342 for reading data from the recording medium. Write channel circuit 340 is composed of an encoder 344, a pre-decoder 346, and a write compensator 348. Read channel circuit 342 is composed of an automatic gain control (AGC) amplifier 350, a low pass filter (LPF) 352, an analog-to-digital converter (ADC) 354, an adaptive equalizer 356, a Viterbi detector 358, a gain controller 360, a timing controller 362, a decoder 364 and a synchronization detector 366.

In operation, encoder 344 encodes write data, input to be written onto the recording medium, into a predetermined code. For example, an RLL (Run Length Limited) code, in which the number of adjacent zeros must remain between specified maximum and minimum values, is commonly used for this predetermined code. However, the present invention is not meant to be limited to RLL and other coding may be used. Pre-decoder 346 is included to prevent error propagation. Write compensator 348 reduces, non-linear influences arising from the read/write head. However, because the response of the actual recording channel does not exactly coincide with this transfer function, some subsequent equalization is always required.

A read channel circuit in a generic read/write channel circuit of a magnetic disk drive device includes components for initial processing of the analog read signal generated by the read/write head of the device. This processing provides automatic gain control (AGC) amplification, filtering, and equalization, as well as analog-to-digital conversion. Automatic gain control (AGC) amplifier 350 amplifies an analog signal read from the disk. Low pass filter 352 removes high frequency noise from and reshapes the signal output from AGC amplifier 350. The signal output from low pass filter 352 is converted into a discrete digital signal by analog-to-digital (A/D) converter 354. The resulting digital signal is then applied to adaptive equalizer 356, which equalizes the signal to generate desired waveforms. Viterbi detector 358 receives the equalized signal output from adaptive equalizer 356 and from it generates encoded data. Decoder 64 decodes the encoded data output from Viterbi detector 358 to generate the final read data. At the same time, in order to correct the analog signal envelope and the digitization sample timing, gain controller 360 controls the gain of AGC amplifier 350 and timing controller 362 controls sample timing for A/D converter 354.

The synchronization detector 366 is a dedicated detector used to determine the start of data. As discussed in detail below, the synchronization detector 366 is optimized for detecting synchronization field and synchronization word patterns.

Figure 4:
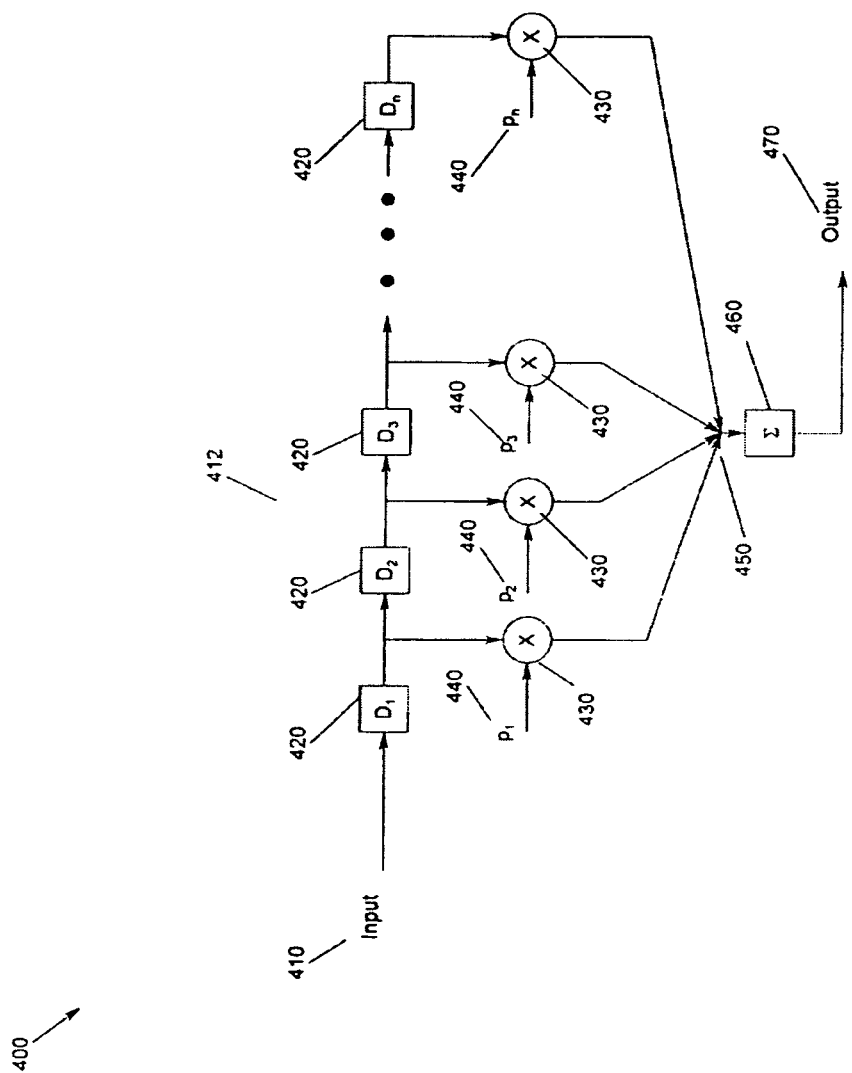
FIG. 4 illustrates an equalizer.

FIG. 4 illustrates an equalizer 400. In FIG. 4, an input signal 410 is fed into a shift register circuit 412. With each successive input to the shift register, the values of the memory elements 420 are tapped off. The tapped signals may be multiplied 430 by selected coefficients 440. The resulting tapped signals 450 are then added 460 to provide an output 470.

FIG. 5 illustrates a block diagram 500 of a data channel that uses a conventional equalization target. In FIG. 5, a readback signal $a_k$ 510 is applied to the equalizer represented by the equalizer target 512 given by $(1-D^2)(1+p_1 D+p_2 D^2)$. A noise whitened target $y_k$ 530 is produced at the input of the Viterbi detector 540.

FIG. 6 illustrates a block diagram 600 of a data channel that uses a conventional equalization target and a matched filter metric. In FIG. 6, a readback signal $a_k$ 610 is applied to the equalizer having an equalizer target 612 given by $(1-D^2)(1+p_1 D+p_2 D^2)$. The equalization target 612 thus includes a base partial response component, i.e., $(1-D^2)$, and a fractional coefficient polynomial component to whiten the noise, i.e., $(1+p_1 D+p_2 D^2)$. A noise whitened target $y_k$ 630 is provided at the input of the matched filter 650. The matched filter 650 is given by $(-1+D^2)(p_2+p_1 D+D^2)$. The matched filter 650 provides an output $z_k$ 660 to the Viterbi detector 640. The matched filter 650 facilitates transformation of the decoded output. Thus, the block diagram 600 of FIG. 6 provides Euclidean metric detection.

FIG. 7 illustrates a block diagram 700 of a data channel that uses a matched 16 state equalization target and a matched filter metric. In FIG. 7, a readback signal $a_k$ 710 is applied to the equalizer represented by a matched 16-state equalizer target 712 given by $(1-D+p_2 D^2)(P_2+p_1 D+D^2)$. A portion of the matched 16-state equalizer target 712 is formerly part of the matched filter 750. A noise target $y_k$ 730 is provided at the input of the matched filter 750. The matched filter 750 is given by $(-1+D2)$. The matched filter 750 provides an output $z_k$ 760 to the Viterbi detector 740.

The matched 16-state (MS16) equalization target 712 is provided by rearranging components of the equalization target with components of the matched filter. The equalization target 712 thus includes a base partial response component, i.e., $(1-D^2)$; a fractional coefficient polynomial component to whiten the noise, i.e., $(1+p_1 D+p_2 D^2)$, and a time-reversed replica of the noise-whitening component 780. Thus, the time-reversed replica of the noise-whitening component 780 comes from the matched filter components shown in FIG. 6.

The matched 16-state equalizer target 712 may be represented by $(1+aD+bD^2-bD^4-aD^5-D^6)$, where $a=(p_1/p_2)+p_1$ and $b=((p_1^2+1)/p_2)+p_2-1$. The MS16 equalization target 712 is a symmetrical target with only two parameters for programming. The a and b parameters allow great flexibility in target response and each can be changed independently while still maintaining a null at DC and at Nyquist.

The MS16 equalization target 712 also exhibits less high frequency energy than the native 16-state equalization target 512, 612 shown in FIGS. 5-6. Very low resolution systems can also be equalized more readily by using the MS16 equalization target 712.

The MS16 equalization target 712 exhibits less SER loss due to tap weight quantization effects. The hardware needs to store the tap weights of the equalization FIR in a finite precision. When these tap weights are quantized, some loss in SER occurs. The MS16 equalization target 712 is superior in this area.

The MS16 equalization target 712 allows the use of a very simple non-programmable matched filter 750 prior to Viterbi detector 740. It has been demonstrated that the overall required precision after the equalization FIR is less when using the MS16 Target 712.

Figure 8:
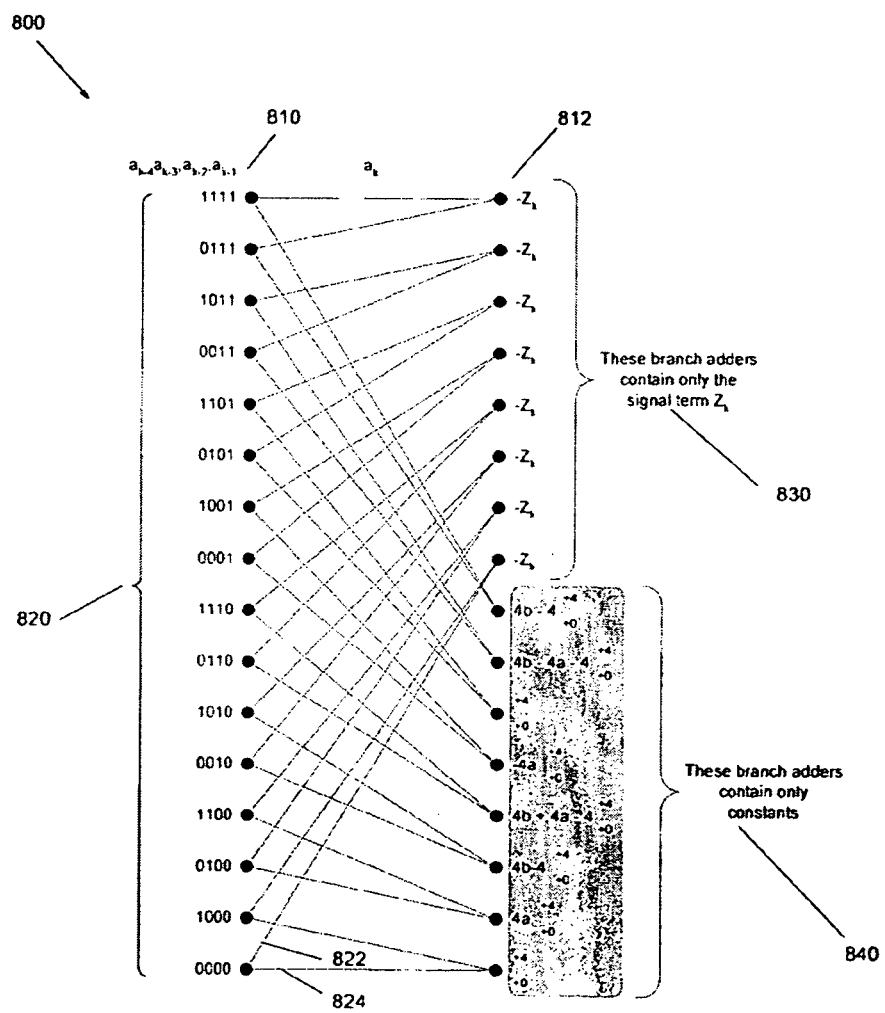
FIG. 8 illustrates a matched filter metric trellis structure.

FIG. 8 illustrates a matched filter metric trellis structure 800. In FIG. 8, the initial codeword states 810 are shown on the left with the possible subsequent codeword states 812 represented on the right. Every codeword is associated with a unique path through the trellis diagram. A trellis diagram has $2^M$ nodes at each stage or time increment t. In FIG. 8, there are 16 nodes 820. There are 2 branches 822, 824 leaving each node. The branches from each node representing possible paths form each node or input value. As can be seen in FIG. 8, the top eight branch adders 830 contain only the signal term $z_k$ and the bottom eight branches 840 contain only constants a and b. As described above, a and b are programmable constants and reflect the programmable detection target in use.

FIG. 9 again shows the data channel of FIG. 7, with the matched filter 950 upstream of the Viterbi detector 940. Embodiments in accordance with the present invention detect a synchronization mark based upon the output ($z_k$) 960 of the matched filter. By identifying the location of the synchronization mark upstream of the Viterbi detector, delay associated with the latency of the Viterbi output is avoided. Avoidance of such a delay allows time to align parity framing, and to properly start the time-varying trellis of the Viterbi detector.

Figure 9:
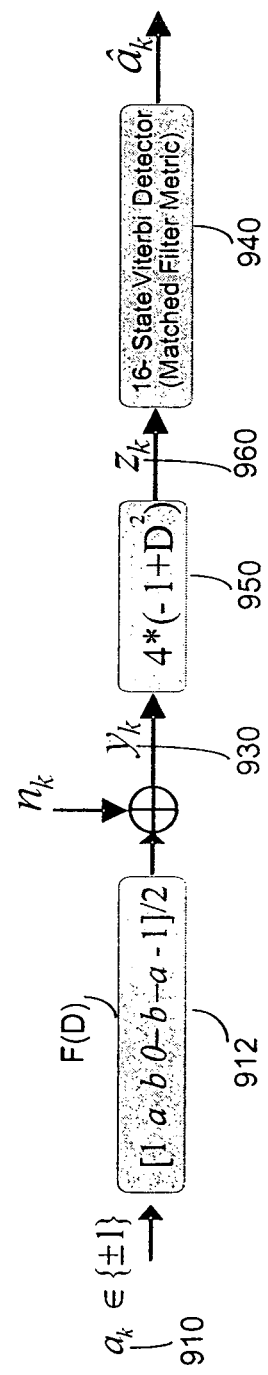
FIG. 9 illustrates a lengthened equalization target filter architecture that comprises a matched 16 state equalizer target and a matched filter.

A data channel of FIG. 9 uses a matched 16 state equalization target 912 and a matched filter 950. The bits that were previously written and are to be detected ($a_k$) 910 are applied to the equalizer represented by a matched 16-state (MS16) equalizer target 912 given by $F(D)=(1-D^2)(1+p_1+p_2 D^2)(p_2+p_1 D+D^2)/2$, where D is a delay, $p_1$ and $p_2$ are parameters. For example, the output of delay D of $a_k$ is $a_{k-1}$. Similarly, the output of delay $D^2$ of $a_k$ is $a_{k-1}$. The output from the equalizer 912 is a noisy equalized signal $y_k$ 930 where $n_k$ is used to denote the noise. $y_k$ is then provided at the input of the matched filter 950 that is given by $4*(-1+D^2)$.

The matched filter 950 provides output $z_k$ 960 to a Viterbi detector 940. The matched 16-state equalizer target 912 may also be represented by $(1+aD+bD^2-bD^4-aD^5-D^6)/2$, where $a=(p_1/p_2)+p_1$ and $b=((p_1^{2+1})/p_2)+p_2-1$.

The MS16 equalization target 912 is a symmetrical target with only two parameters for programming. The a and b parameters allow great flexibility in target response and each can be changed independently. The matched 16 state (MS16) equalization target exhibits less high frequency energy than the native 16-state equalization target. Such an equalization target is described in the U.S. Pat. No. 7,286,595.

Figure 10:
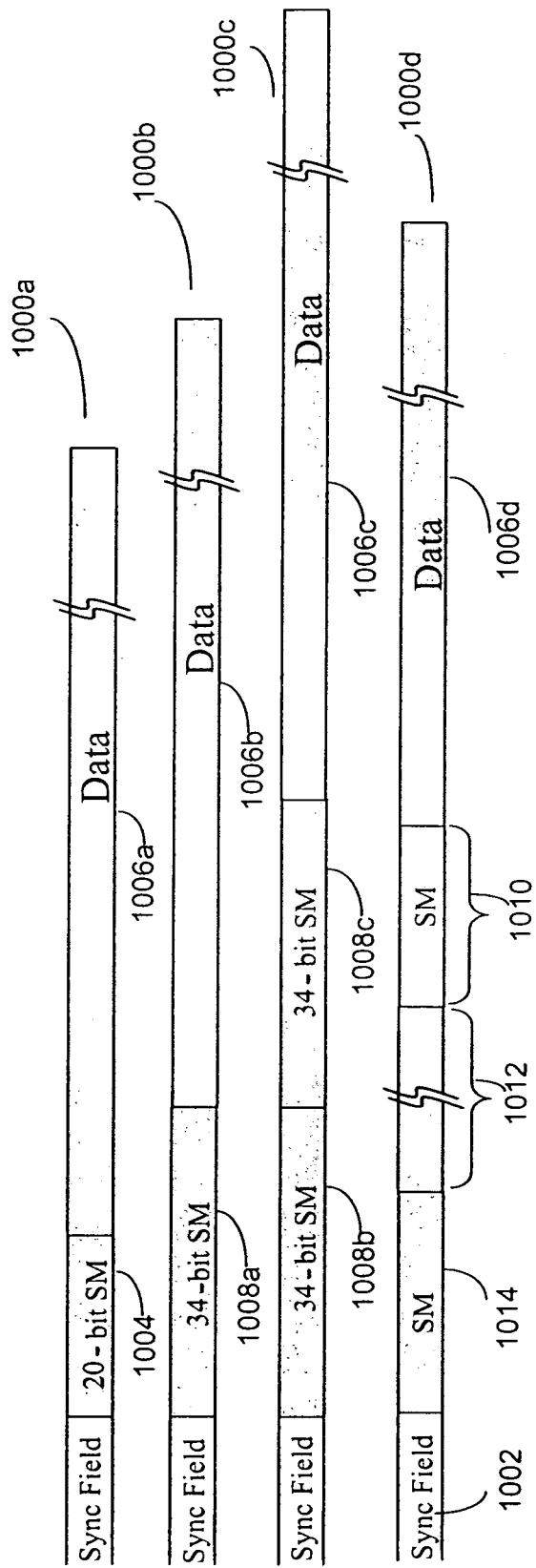
FIG. 10 is a diagram illustrating various formats of primary synchronization marks and embedded synchronization marks according to embodiments of the invention.

Embodiments of the invention include various formats for primary and embedded synchronization marks that are to be detected from the output of the matched filter, upstream of the Viterbi detector. FIG. 10 is a diagram illustrating various formats (1000a, 1000b, 1000c, and 1000d) of primary synchronization marks and embedded synchronization marks. Specifically, 20 bit, 34 bit primary synchronization marks may be or may not be found with embedded synchronization marks. The primary synchronization mark may also have 40-bit, 68-bit, 80-bit or 136-bit, and the like. The bits that were previously written and which are now to be detected ($a_k$) shown in FIG. 9 includes such predefined primary or embedded synchronization marks that are recorded on a medium.

A primary synchronization mark is located prior to a data region and is used for detection of the starting location of data recorded on the media. One synchronization mark format 1000a of FIG. 10 includes a preamble or synchronization field 1002, followed by a 20-bit primary synchronization mark 1004, and then a data region 1006a which does not have an embedded synchronization mark. In another set of embodiments, synchronization mark format 1000b includes a preamble 1002, followed by a 34-bit primary synchronization mark 1008a, and then a data region 1006b without any embedded synchronization mark. According to other embodiments, the format 1000c includes a preamble or synchronization field 1002, followed by two 34-bit primary synchronization marks 1008b and 1008c, and then data region 1006c again lacking any embedded synchronization marks.

FIG. 11A is a diagram illustrating a conventional 34-bit primary synchronization mark 1100 described in the U.S. Pat. No. 7,010,065. The 34-bit primary synchronization mark 1100 has three pattern matches 1104a, 1104b and 1104c. Pattern match 1104b is identical to pattern match 1104c except that it is flipped in polarity. Pattern match 1104a has 6 bits while pattern matches 1104b and 1104c has 10 bits.

The conventional synchronization mark 1100 shown in FIG. 11A, may be effectively contrasted with embodiments of the present invention with reference to FIG. 11B, which illustrates a 34-bit primary synchronization mark 1102 according to an embodiment of the present invention 1102. That synchronization mark 1102 has three pattern matches 1120a, 1120b and 1120c. Pattern matches 1120a and 1120c have 10 bits, while pattern match 1120b has 12 bits.

Moreover, in addition to heightened accuracy, specific embodiments of the primary synchronization marks according to the present invention improve the speed of detection of synchronization mark location. Specifically, by detecting the synchronization mark prior to the Viterbi trellis, latency of Viterbi output is avoided and more time is allowed to align parity framing and to properly start the time-varying trellis.

FIG. 11C is a diagram illustrating a 20-bit primary synchronization mark of the present invention 1104. The synchronization mark 1104 has one pattern match 1130. The use of such synchronization marks as shown in FIGS. 11B and 11C yield lower error rates than the synchronization mark 1100 shown in FIG. 11A. Note that in FIGS. 11B and 11C, the 2-bits before the start of the 34-bit and 20-bit primary synchronization marks always end as high (one).

Embodiments of the present invention also provide 16-bit, 20-bit and 24-bit patterns representing embedded synchronization marks. Such an embedded synchronization mark is located within a data region.

Specifically, returning to FIG. 10, format 1000d includes an embodiment of an embedded synchronization mark according to the present invention. Format 1000d includes a preamble or synchronization field 1002, followed by a primary synchronization mark 1014, then by a data region 1012. Embedded synchronization mark 1010 lies within data region 1006d. The data region 1012 is before the embedded synchronization mark 1010, while the data region 1006d is after the embedded synchronization mark 1010. Error correction code (ECC) can erase the data region 1012 when only the embedded synchronization mark 1010 is found.

Figure 12:
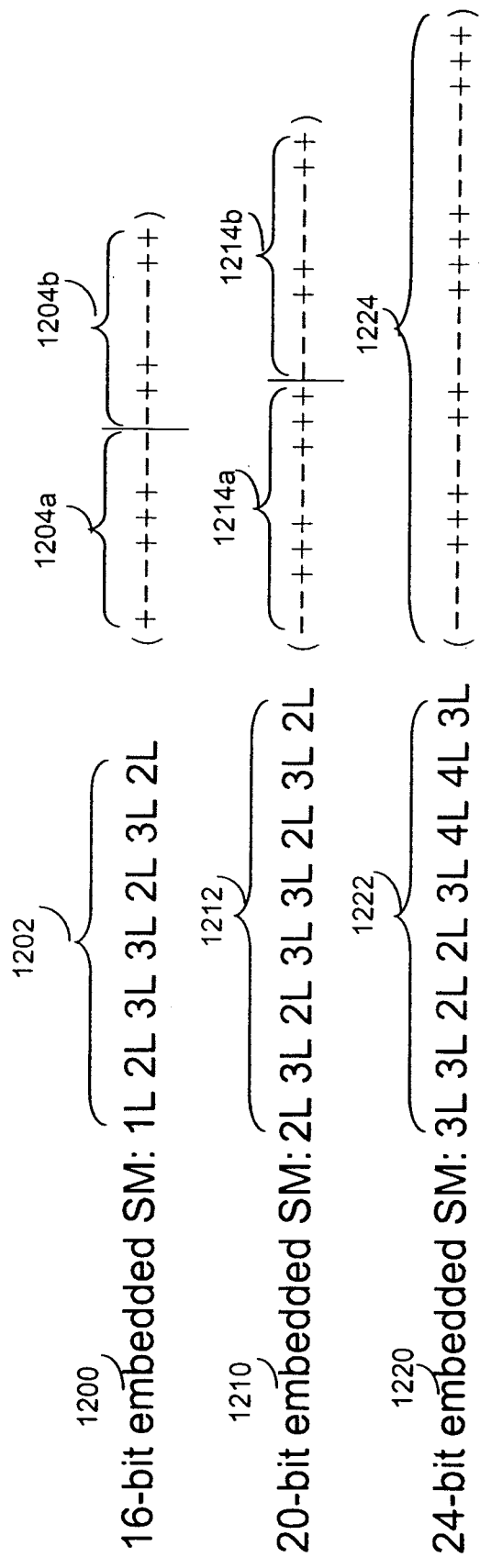
FIG. 12 shows 16-bit, 20-bit and 24 bit embedded synchronization marks according to embodiments of the invention.

FIG. 12 is a diagram illustrating 16-bit, 20-bit, and 24-bit embedded synchronization marks according to embodiments of the present invention. Specifically, an embodiment of a 16-bit embedded synchronization mark 1200 is described by a length pattern 1202 and polarity patterns 1204a and 1204b. This 16-bit embedded synchronization mark includes two 8-bit symbol patterns 1204a and 1204b, which are opposite in polarity, represented by:

1L 2L 2L 3L 2L 3L 2L (+--+++---++---++).

Similarly, the 20-bit embedded synchronization mark includes two 10-bit symbols the length patterns 1212 and polarity patterns 1214a and 1214b, represented by:

2L 3L 2L 3L 3L 2L 3L 2L (--+++--+++---++----++).

The polarity pattern 1214b is a reversed pattern of 1214a, in both a sequence of the length pattern and in polarity.

Additionally, a 24-bit embedded synchronization mark pattern 1220 is described by the length pattern 1222 and a polarity pattern 1224, represented by:

3L 3L 2L 2L 3L 4L 4L 3L (---+++--++---++++----+++).

The detection of such embedded synchronization marks helps with identifying the data region that requires ECC.

Figure 13A:
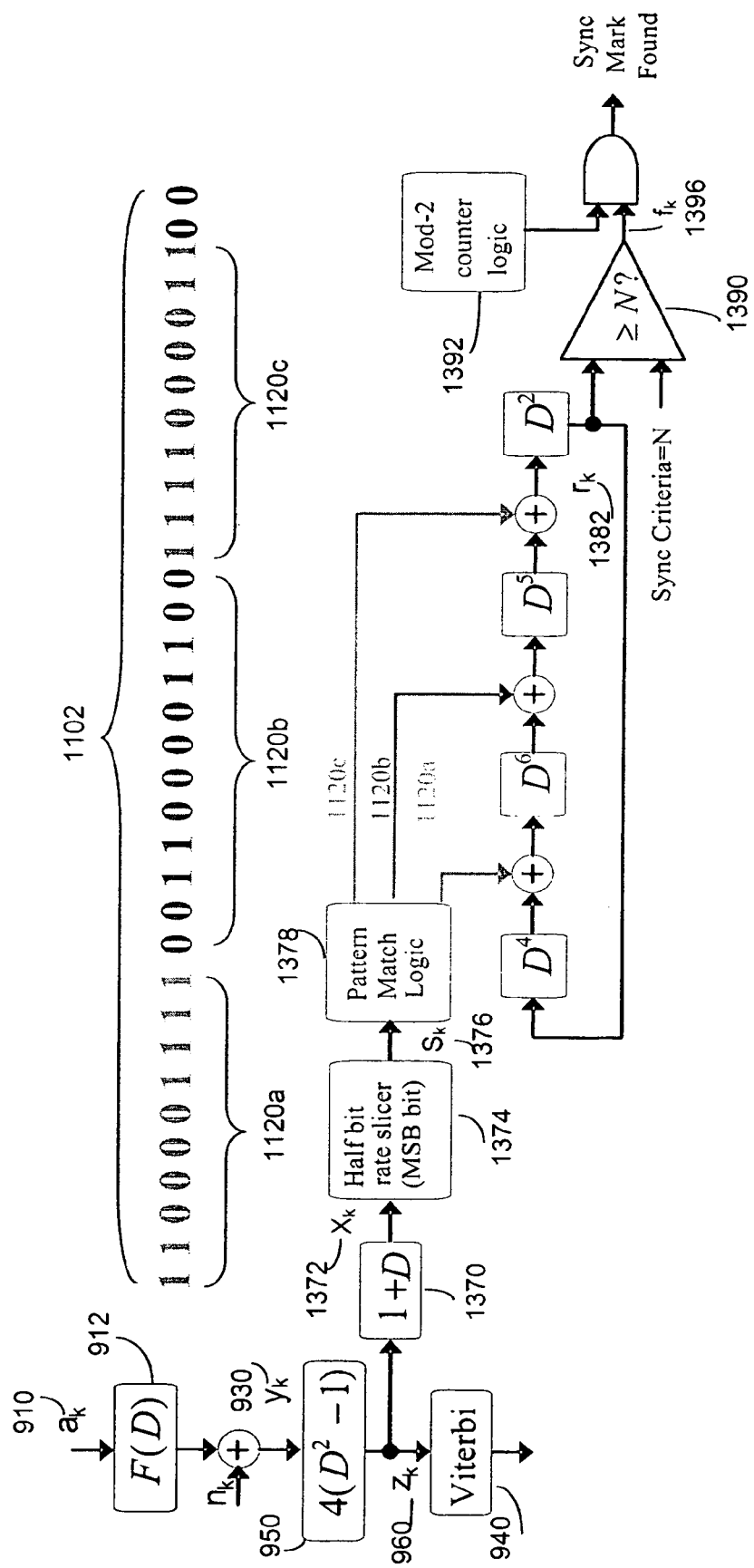
FIGS. 13A-13B illustrate exemplary 34-bit and 20-bit primary synchronization detectors according to embodiments of the invention.

Embodiments of the invention provide the corresponding detectors for synchronization marks. For example, FIG. 13A illustrates a block diagram of an exemplary synchronization detector for detecting a 34-bit primary synchronization mark according to an embodiment of the present invention. As also shown above in FIG. 11B, the pattern of the 34-bit primary synchronization mark comprises 2L magnetic patterns.

The previously written bits that are to be detected ($a_k$) 910 are applied to the equalizer 912 given by F(D) to generate noisy equalized signal $y_k$ 930 where $n_k$ is used to denote the noise. Then, $y_k$ 930 is applied to a first matched filter 950 given by $4*(-1+D^2)$ to generate $z_k$ 960. This is the same as shown in FIG. 9.

However, rather than using $z_k$ 960 as the direct input to a Viterbi detector 940 as shown in FIG. 9, in the embodiment of FIG. 13A, $z_k$ 960 is applied to a second matched filter (MF) 1370 to generate an output $x_k$ 1372. $z_k$ 960 is a MF output for single bit, while $x_k$ 1372 is a MF output for 2 bits or 2L magnets. The second matched filter 1370 is given by (I+D).

The output $x_k$ 1372 is applied to a half bit rate slicer (MSB bit) 1374 to form an output $s_k$ 1376 that is a number of 2 magnets, where MSB stands for a most significant bit. Next, $s_k$ 1376 is applied to a pattern match logic block 1378 to generate one of pattern matches 1120a, 1120b and 1120c. If the pattern match 1120a is the output from the pattern match logic block 1378, the pattern match 1120a is delayed by $D^6$ and then delayed by $D^5$ to yield an output $r_k$ 1382. Furthermore, if the pattern match 1120b is the output from the pattern match logic block 1378, the pattern match 1120b is delayed by $D^5$ to yield an output $r_k$ 1382. Additionally, if the pattern match 1120c is the output from the pattern match logic block 1378, the pattern match 1120c is the output $r_k$ 1382. The loop indicated by the arrow between $D^2$ and $D^4$ covers the situation where the synchronization mark is repeated several times.

In the embodiment of FIG. 13A, the $r_k$ 1382 is further delayed by $D^2$ to input to a comparison block 1390 to compare the signal with synchronization criteria N at a comparison block 1390. For each 34-bit synchronization mark 1102, a minimum of 2 out of 3 pattern matches 1120a, 1120b and 1120c are required to be identified to provide the start of data trigger for the Viterbi detector 358 as shown in FIG. 3. Similarly, for 68-bit synchronization mark (or two 34-bit synchronization marks), a minimum 2 matches out of 6 are required. Additionally, for 102-bit synchronization mark, a minimum of 2 matches out of 9 are required. The normal, minimum or relaxed, and maximum criteria N for pattern matches 1120a, 1120b and 1120c of the 34-bit primary synchronization mark are shown in TABLE A below:

TABLE A

| CRITERIA | # OF CONSECUTIVE 34-BIT PRIMARY SYNCHRONIZATION MARKS | | |
|---|---|---|---|
| | One 34-bit Sync Mark | Two 34-bit Sync Marks | Three 34-bit Sync Marks |
| NORMAL | N = 2 of 3 | N = 3 of 6 | N = 4 of 9 |
| RELAXED | N = 2 of 3 | N = 2 of 6 | N = 2 of 9 |
| MAXIMUM | N = 3 of 3 | N = 6 of 6 | N = 9 of 9 |

In one embodiment of the invention, a mod-2 counter logic is used to detect a primary synchronization mark. In FIG. 13A, $f_k$ 1396 is compared with a mod-2 counter logic 1392 to determine if it is one at the end of the synchronization field. If it is one in proper phase alignment with the synchronization field (as determined by the modulo counter), the synchronization mark is found.

Figure 13B:
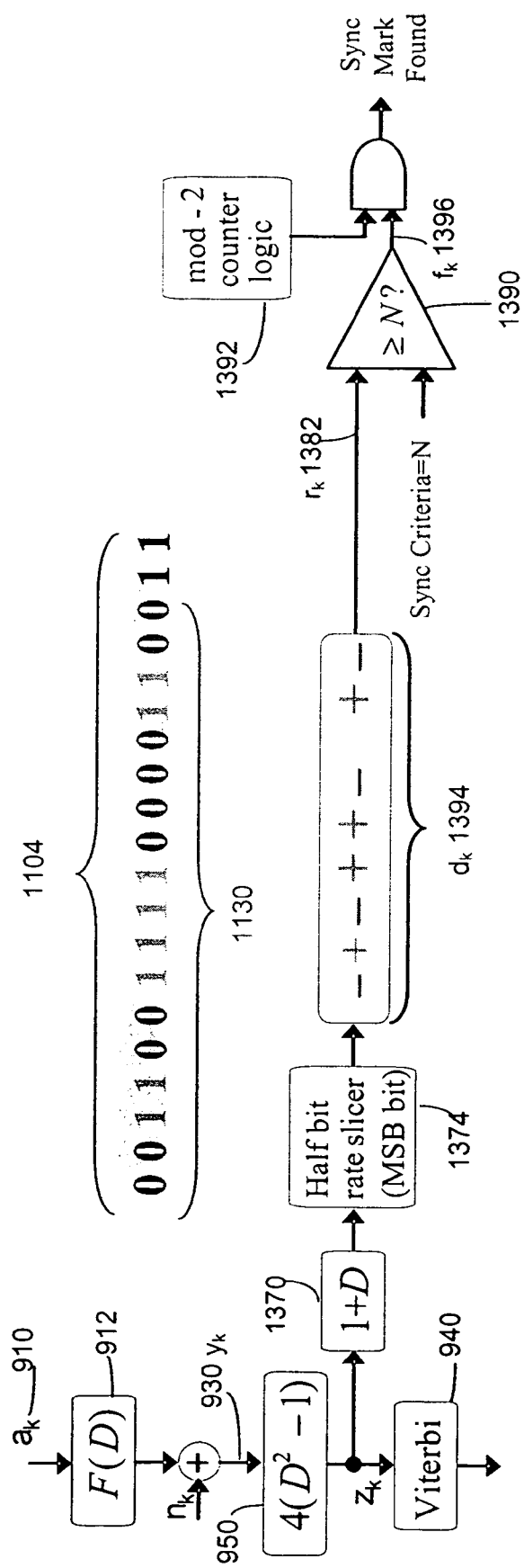

FIG. 13B illustrates a simplified block diagram of an exemplary synchronization detector for detecting a 20-bit primary synchronization mark according to an embodiment of the present invention. The output $d_k$ 1394 from the half bit slicer (MSB) is pattern match 1130 that has a number of 2 length magnets. As the pattern match 1130 for the 20-bit primary synchronization mark has 18 bits, there are maximum 9 pairs. TABLE B below shows the different criteria N for pattern matches for detection of a 20-bit primary synchronization mark:

TABLE B

| CRITERIA | One 20-BIT PRIMARY SYNCHRONIZATION MARK |
|---|---|
| NORMAL | N = 7 of 9 |
| RELAXED | N = 6 of 9 |
| MAXIMUM | N = 9 of 9 |

Figure 14:
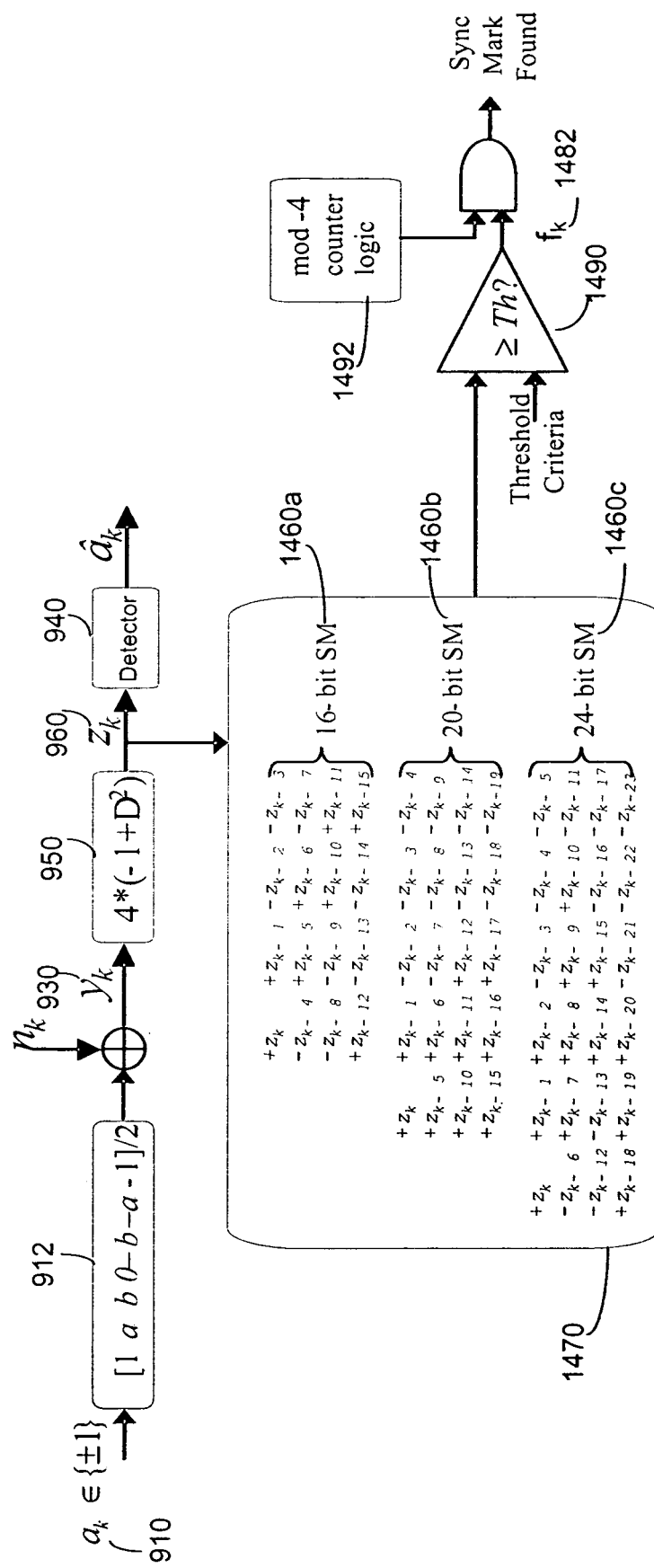
FIG. 14 illustrates exemplary 16-bit, 20-bit, and 24-bit embedded synchronization detectors according to embodiments of the invention.

Embodiments of the invention further provide circuits for detecting the 16-bit, 20-bit and 24-bit embedded synchronization marks. FIG. 14 shows a simplified embodiment of such a detection circuit, which also uses the matched 16 state equalization target 912 and a matched filter 950 shown in FIG. 9. As shown in FIG. 14, one of the 16-bit, 20-bit or 24-bit embedded synchronization pattern matches 1460a, 1460b and 1460c is generated from the output $z_k$ 960 of the matched filter 950.

In the 16-bit embedded synchronization mark 1460a, the polarities of the outputs $z_{k-15}$ through $z_k$ have the polarity patterns 1204a and 1204b shown in FIG. 12. Similarly, in the 20-bit embedded synchronization mark 1460b, the polarities of $z_{k-19}$, $z_{k-18}$, through $z_k$ have the polarity patterns 1214a and 1214b shown in FIG. 12. Additionally, in the 24-bit embedded synchronization mark 1460c, the polarities of $z_{k-23}$, $z_{k-22}$, through $z_k$ have the polarity pattern 1224 shown in FIG. 12.

When one of the embedded synchronization pattern matches 1460a, 1460b, 1460c is generated from $z_k$ 960 in a generator 1470, the generated embedded synchronization pattern match is compared with the threshold criteria N at block 1490. The specific criteria for detection may be programmable to be between 70 and 90 percent of maximum noiseless matched filter output.

The value of the maximum noiseless matched filter output, however, depends upon the a & b parameters, and which embedded synchronization mark is used. Let m denote max value, then m is given by:

m=16(6b+3a−2)−7, for 16-bit embedded sync mark
m=8(15b+9a−5)−9, for 20-bit embedded sync mark
m=8(15b+11a), for 12-bit embedded sync mark The threshold criteria for detection can then efficiently be implemented, for example, as threshold=m/2+m/4+i(m/32), where i is programmable to either 1, 2, 3, or 4.

In a specific embodiment of the invention, a mod-4 counter logic is used to detect an embedded synchronization mark. The output $f_k$ 1482 is then compared with a mod-4 counter logic 1492 to determine if it is one. If it is one in proper phase alignment with the synchronization field (as determined by modulo counter), the synchronization mark is found.

Figure 15:
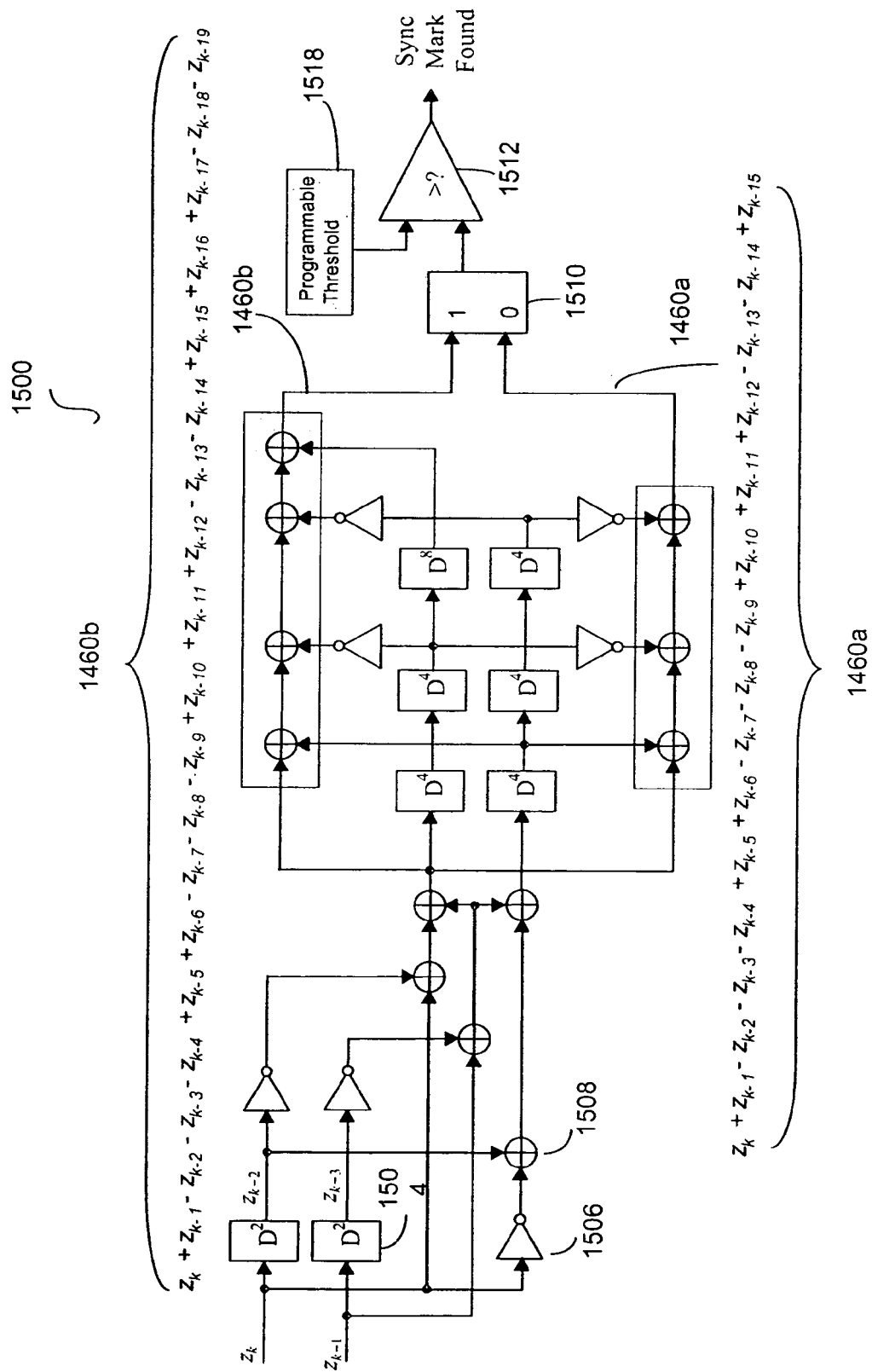
FIGS. 15-16 illustrate exemplary circuit architectures for generators and detectors of 16-bit 20-bit and 24-bit embedded synchronization marks according to embodiments of the invention.
Figure 16:
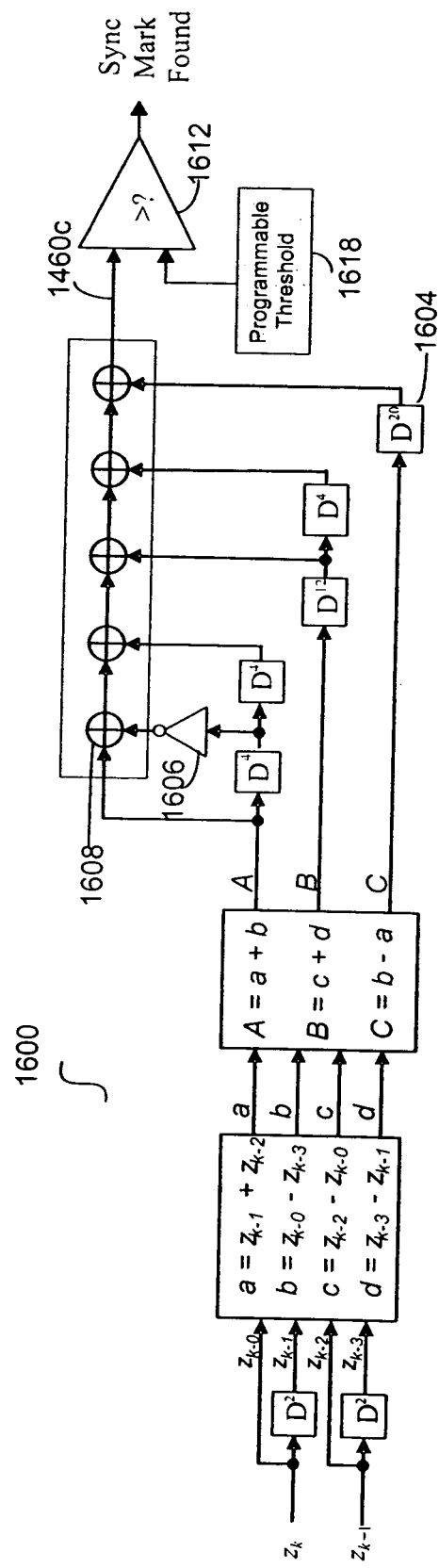

FIGS. 15 and 16 show specific architectures for circuits for generating and detecting embedded synchronization pattern matches 1460a, 1460b according to embodiments of the present invention. FIG. 15 illustrates an exemplary circuit architecture for 16-bit and 20-bit embedded synchronization detectors. The circuit 1500 comprises delays 1504, polarity inverters 1506, addition blocks 1508, a 10-bit symbol mode 1510, and a comparison block 1512. The delays 1504 may have $D^2$, $D^4$, and $D^8$. The circuit 1500A generates 20-bit and 16-bit embedded synchronization pattern matches 1460b, 1460a. The 20-bit and 16-bit embedded synchronization pattern matches 1460b and 1460a are applied to a 10 bit symbol mode 1510. If the 10 bit symbol mode 1510 is one, the 20-bit embedded synchronization pattern match 1460b is applied to a comparison block 1512 to compare with a programmable threshold 1518 to determine if the synchronization mark is found or not. If the 10-bit symbol mode 1510 is zero, the 16-bit embedded synchronization pattern match 1460a is applied to the comparison block 1512.

FIG. 16 illustrates an exemplary circuit architecture 1600 for generating and detecting 24-bit embedded synchronization pattern match 1460c according to an embodiment of the present invention. The circuit 1600 comprises delays 1604, polarity inverters 1606, addition blocks 1608, a comparison block 1612. The delays 1604 may have $D^2$, $D^4$, $D^{12}$ and $D^{20}$. The circuit 1600 generates the 24-bit embedded synchronization pattern match 1460c. The embedded synchronization pattern match 1460c is applied to a comparison block 1612 to compare with a programmable threshold to determine if the synchronization mark is found or not.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims alone with their full scope of equivalents.

What is claimed is:

1. An apparatus for synchronization detection, comprising:
   an equalizer configured to receive a readback signal including a predefined synchronization pattern, and to generate a first equalized signal from a lengthened equalization target filter with a matched filter, wherein the predefined synchronization pattern comprises a plurality of synchronization pattern matches;
   a generator upstream of a Viterbi detector that is configured to generate a second signal from the first equalized signal, the second signal comprising one of the synchronization pattern matches;
   an analyzer upstream of the Viterbi detector that is configured to compare the second signal to a predefined criteria to generate an output; and
   a logic counter upstream of the Viterbi detector that is configured to analyze the generate a start of data trigger in subsequent data detection circuitry based upon the predefined criteria.

2. The apparatus of claim 1, wherein the predefined synchronization pattern comprises a primary synchronization mark located at a start of a data region.

3. The apparatus of claim 2, wherein the primary synchronization mark comprises 34-bit or 20-bits.

4. The apparatus of claim 3, wherein the 34-bit primary synchronization mark is 0011110000110011110011000011110011.

5. The apparatus of claim 4, wherein the predefined criteria requires at least two out of the three pattern matches for detection of the 34-bit primary synchronization mark in a time sequence.

6. The apparatus of claim 3, wherein the 20-bit primary synchronization mark is 11110011001111000011.

7. The apparatus of claim 6, wherein the predefined criteria requires at least seven out of nine pairs of 2 lengths magnets for detection of the 20-bit primary synchronization mark in a time sequence.

8. The apparatus of claim 2, wherein the logic counter comprises a mod-2 counter for analyzing the output from the analyzer to determine if the primary synchronization mark is found.

9. The apparatus of claim 2, wherein the predefined synchronization pattern comprises exclusively repetition of pairs of zeros and pairs of ones.

10. The apparatus of claim 1, wherein the lengthened equalization target comprises a mathematical convolution of a first and a second transfer function, the first transfer function comprising a predetermined equalization target for providing desired shaping to the read signal, and the second transfer function comprising a matched filter function providing a time-reversed component that is a time-reversed replica of a whitening filter component of the equalization target.

11. The apparatus of claim 1, wherein the lengthened equalization target has the form $(1-D^2)(1+p^1D+p^2D^2)(p^2+p^1D+D^2)/2$ and is symmetrical.

12. The apparatus of claim 1, wherein the lengthened equalization target has the form $(1+aD+bD^2-bD^4-aD^5-D^6)/2$, wherein $a=(p_1/p_2)+p_1$ and $b=((p_1^2+1)/p_2)+p_2-1$.

13. The apparatus of claim 12, wherein a and b are programmable constants.

14. The apparatus of claim 1, wherein the predefined synchronization pattern comprises an embedded synchronization mark located within a data region.

15. The apparatus of claim 14, wherein embedded synchronization mark comprises 16 bits made up of two 8-bit symbol patterns of an opposite polarity.

16. The apparatus of claim 15, wherein the 16-bit embedded synchronization mark is 1001110001100011.

17. The apparatus of claim 14, wherein the embedded synchronization mark comprises 20 bits made up of first and a second 10-bit symbol patterns, the first 10-bit symbol pattern having opposite polarity and reverse sequence from the second 10-bit symbol pattern.

18. The apparatus of claim 17, wherein the 20-bit embedded synchronization mark predefined criteria for detection of the 16-bit embedded synchronization mark is 00111001110001100011.

19. The apparatus of claim 14, wherein embedded synchronization mark comprises 24 bits.

20. The apparatus of claim 19, wherein embedded synchronization mark is 000111001100011110000111.

21. The apparatus of claim 14, wherein the logic counter comprises a mod-4 counter for analyzing the output from the analyzer to determine if the embedded synchronization mark is found.

22. A method for synchronization detection, comprising:
    applying a readback signal including a predefined synchronization pattern to an equalizer having a lengthened equalization target filter with a matched filter to generate a first equalized signal, wherein the predefined synchronization pattern comprises a plurality synchronization pattern matches;
    producing a second signal from the first equalized signal prior to processing the equalized readback signal by a Viterbi detector, the second signal comprising one of the synchronization pattern matches;
    comparing the second signal to a predefined criteria prior to processing the equalized readback signal by the Viterbi detector; and
    generating a start of data trigger prior to processing the equalized readback signal by the Viterbi detector in subsequent data detection circuitry based upon the predefined criteria.

23. The method of claim 22, wherein the predefined synchronization pattern comprises 34-bit or 20-bit primary synchronization marks, wherein each of the primary synchronization marks comprises a plurality of synchronization pattern matches.

24. The method of claim 23, wherein the 34-bit primary synchronization mark includes three pattern matches, and wherein the predefined criteria requires at least two out of the three pattern matches to start the data trigger.

25. The method of claim 23, wherein the 20-bit primary synchronization mark includes one pattern match that has 9 pairs of 2 lengths magnets, wherein the predefined criteria requires at least 7 out of 9 matches to start the data trigger.

26. The method of claim 22, wherein the predefined synchronization pattern comprises 16-bit, 20-bit, or 24-bit embedded synchronization marks, wherein each of the embedded synchronization marks comprises a plurality of embedded synchronization pattern matches.

* * * * *